(12) United States Patent
Shimodaira

(10) Patent No.: US 9,893,002 B2
(45) Date of Patent: Feb. 13, 2018

(54) TERMINAL STRUCTURE AND WIRING SUBSTRATE

(71) Applicant: SHINKO ELECTRIC INDUSTRIES CO., LTD., Nagano-shi, Nagano-ken (JP)

(72) Inventor: Tomoyuki Shimodaira, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 15/373,107

(22) Filed: Dec. 8, 2016

(65) Prior Publication Data

US 2017/0179012 A1 Jun. 22, 2017

(30) Foreign Application Priority Data

Dec. 18, 2015 (JP) ................................. 2015-247602

(51) Int. Cl.
*H01L 23/498* (2006.01)
*H01L 23/00* (2006.01)
(Continued)

(52) U.S. Cl.
CPC .... *H01L 23/49816* (2013.01); *H01L 21/4853* (2013.01); *H01L 23/3185* (2013.01); *H01L 23/49822* (2013.01); *H01L 23/49827* (2013.01); *H01L 23/49838* (2013.01); *H01L 23/49866* (2013.01); *H01L 24/05* (2013.01); *H01L 24/08* (2013.01); *H01L 2224/08238* (2013.01); *H01L 2924/0132* (2013.01); *H01L 2924/1431* (2013.01); *H01L 2924/1432* (2013.01); *H01L 2924/1436* (2013.01); *H01L 2924/1437* (2013.01); *H01L 2924/1438* (2013.01);
(Continued)

(58) Field of Classification Search
CPC .......... H01L 23/49816; H01L 23/3185; H01L 23/49827; H01L 23/49838; H01L 21/4853; H01L 24/05; H01L 24/08; H01L 2924/08238; H01L 2924/0132; H01L 2924/1431–2924/1438; H01L 2924/15747; H01L 2924/3512
See application file for complete search history.

(56) References Cited

U.S. PATENT DOCUMENTS

| | | | | |
|---|---|---|---|---|
| 4,818,728 A | * | 4/1989 | Rai .......................... | H01L 24/10 228/123.1 |
| 5,795,818 A | * | 8/1998 | Marrs ..................... | H01L 24/12 257/E21.511 |

(Continued)

FOREIGN PATENT DOCUMENTS

JP 2012-506628 A 3/2012
JP 2012-129369 A 7/2012

*Primary Examiner* — Hoa C Nguyen
(74) *Attorney, Agent, or Firm* — Tarolli, Sundheim, Covell & Tummino LLP

(57) ABSTRACT

A terminal structure of a wiring substrate includes a wiring layer, a protective insulation layer including an opening that partially exposes an upper surface of the wiring layer, and a connection terminal formed on the wiring layer. The connection terminal includes a base portion formed in the opening and a connection portion formed on the base portion. The connection portion projects from an upper surface of the protective insulation layer. A gap is formed between a side surface of the base portion and a wall surface of the opening.

10 Claims, 6 Drawing Sheets

(51) Int. Cl.
    *H01L 23/31*    (2006.01)
    *H01L 21/48*    (2006.01)
(52) U.S. Cl.
    CPC ............... *H01L 2924/15747* (2013.01); *H01L 2924/3512* (2013.01)

(56) References Cited

U.S. PATENT DOCUMENTS

| | | | | |
|---|---|---|---|---|
| 6,337,822 | B1* | 1/2002 | Kwak | G11C 7/1006 365/203 |
| 8,089,156 | B2* | 1/2012 | Nagai | H01L 24/11 257/737 |
| 8,710,657 | B2* | 4/2014 | Park | H01L 23/3128 257/738 |
| 9,293,432 | B2* | 3/2016 | Lin | H01L 23/49816 |
| 9,548,282 | B2* | 1/2017 | Lin | H01L 24/13 |
| 2002/0056741 | A1* | 5/2002 | Shieh | B23K 20/004 228/180.5 |
| 2009/0020322 | A1* | 1/2009 | Hsu | H01L 23/498 174/257 |
| 2011/0156253 | A1* | 6/2011 | Tsai | H01L 24/03 257/738 |
| 2015/0228595 | A1* | 8/2015 | Willeke | H01L 21/32139 438/614 |
| 2016/0148888 | A1* | 5/2016 | Ryu | H01L 24/14 257/621 |

\* cited by examiner

TERMINAL STRUCTURE AND WIRING SUBSTRATE

CROSS-REFERENCE TO RELATED APPLICATIONS

This application is based upon and claims the benefit of priority from prior Japanese Patent Application No. 2015-247602, filed on Dec. 18, 2015, the entire contents of which are incorporated herein by reference.

FIELD

This disclosure relates to a terminal structure, a method for manufacturing a terminal structure, and a wiring substrate.

BACKGROUND

A semiconductor element is, for example, flip-chip-mounted on a wiring substrate. The wiring substrate includes an electrode (pad), a solder resist, which includes an opening that exposes the electrode, and a bump, which is located on the electrode and projects from the opening of the solder resist. The semiconductor element is connected to the bump. The bump is formed, for example, through electrolytic plating. For example, a seed layer is formed on a surface of the solder resist, and electrolytic plating is performed using the seed layer as a power feeding electrode to form an electrolytic plating layer. The electrolytic plating layer undergoes a reflow process to form the bump. Japanese Laid-Open Patent Publication No. 2012-129369 and Japanese National Phase Laid-Open Patent Publication No. 2012-506628 each describe an example of such a wiring substrate (terminal structure).

The bump formed as described above is in contact with a wall surface of the solder resist defining the opening. The solder resist has a greater thermal expansion coefficient than the bump. Thus, when the temperature changes, stress applied to the interface between the solder resist and the bump may form cracks in the bump.

SUMMARY

One embodiment of this disclosure is a terminal structure that includes a wiring layer, a protective insulation layer including an opening that partially exposes an upper surface of the wiring layer, and a connection terminal formed on the wiring layer. The connection terminal includes a base portion formed in the opening. The connection terminal also includes a connection portion formed on the base portion and projecting from an upper surface of the protective insulation layer. A gap is formed between a side surface of the base portion and a wall surface of the opening.

Other embodiments and advantages thereof will become apparent from the following description, taken in conjunction with the accompanying drawings, illustrating by way of example the principles of this disclosure.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Figure 1:
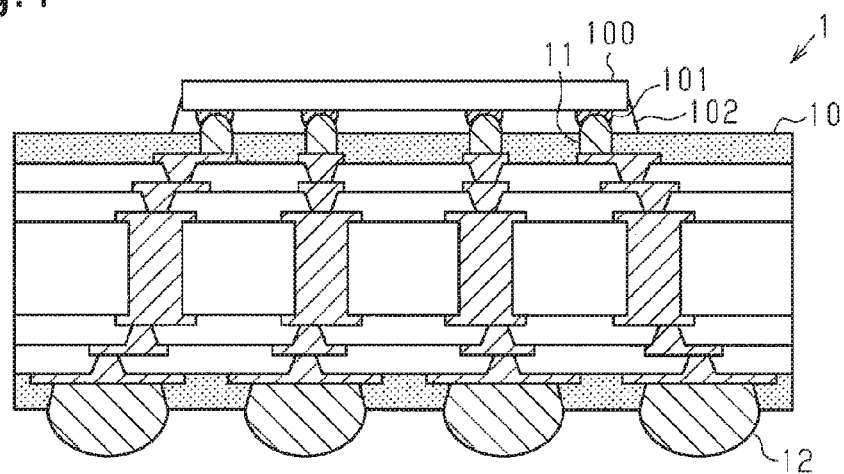
FIG. 1 is a schematic cross-sectional view illustrating one embodiment of a semiconductor device.

One embodiment will now be described with reference to the accompanying drawings. Elements in the drawings may be partially enlarged for clarity and thus have not necessarily been drawn to scale. To facilitate understanding, hatching lines may not be illustrated in the cross-sectional drawings.

As illustrated in FIG. 1, a semiconductor device 1 includes a wiring substrate 10 and a semiconductor element 100. The wiring substrate 10 includes an upper surface on which bumps 11 are formed. The semiconductor element 100 is mounted on the bumps 11. The semiconductor element 100 is connected to the bumps 11 by solder members 101. The solder members 101 are each, for example, a solder bump and formed on the semiconductor element 100. The gap between the wiring substrate 10 and the semiconductor element 100 is filled with an underfill resin 102.

The wiring substrate 10 includes a lower surface on which solder bumps 12 are formed. The solder bumps 12 are each an external connection terminal used for mounting the semiconductor device 1, that is, the wiring substrate 10, to another substrate (e.g., mount board such as motherboard). The external connection terminal may be a solder ball, a lead pin, a stud bump, or the like.

The semiconductor element 100 may be a logic chip such as a central processing unit (CPU) chip or a graphics processing unit (GPU) chip. Alternatively, the semiconductor element 100 may be a memory chip such as a dynamic random access memory (DRAM) chip, a static random access memory (SRAM) chip, or a flash memory chip. Further, a plurality of semiconductor elements 100 including a combination of a logic chip and a memory chip may be mounted on the wiring substrate 10.

Figure 2A:
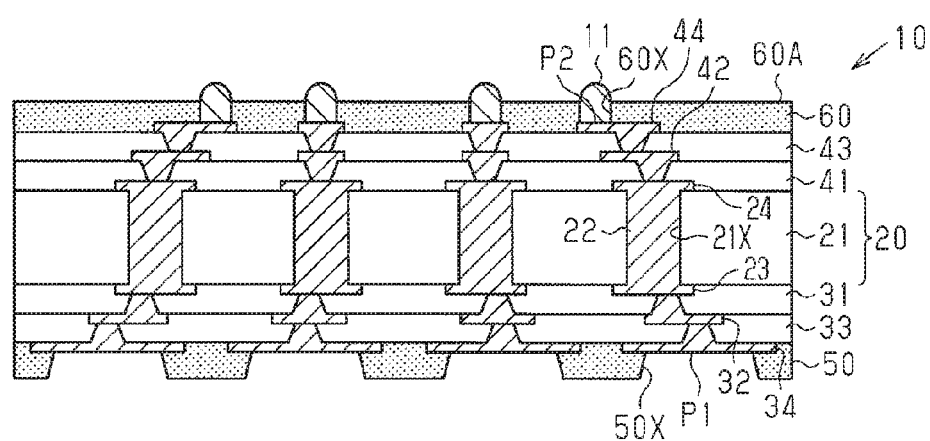
FIG. 2A is a schematic cross-sectional view illustrating one embodiment of a wiring substrate (terminal structure)

The wiring substrate 10 will now be described in detail. As illustrated in FIG. 2A, the wiring substrate 10 includes a substrate body 20, which is located at a middle position of the wiring substrate 10 in the thickness-wise direction.

The substrate body 20 includes a core substrate 21 and through electrodes 22, which are formed in through holes 21X that extend through the core substrate 21 in the thickness-wise direction. The substrate body 20 also includes a wiring layer 23, which is formed on a lower surface of the core substrate 21, and a wiring layer 24, which is formed on an upper surface of the core substrate 21. The wiring layers 23, 24 are electrically connected to each other by the through electrodes 22.

The material of the core substrate 21 may be a glass-epoxy resin obtained, for example, by impregnating a glass cloth (glass woven cloth), which is a reinforcement material, with a thermosetting insulative resin, the main component of which is an epoxy resin, and curing the resin. The reinforcement material is not limited to a glass cloth and may be, for example, a glass non-woven cloth, an aramid woven cloth, an aramid non-woven cloth, a liquid crystal polymer (LCP) woven cloth, or an LCP non-woven cloth. The thermosetting insulative resin is not limited to an epoxy resin and may be, for example, a resin material such as a polyimide resin or a cyanate resin. The material of the through electrodes 22 and the wiring layers 23, 24 may be, for example, copper (Cu) or a copper alloy.

A plurality of (two, in FIG. 2A) insulation layers 31, 33 and a plurality of (two, in FIG. 2A) wiring layers 32, 34 are alternately formed on a lower surface of the substrate body 20. The insulation layer 31 is formed on the lower surface of the core substrate 21 to cover the wiring layer 23. The wiring layer 32 is formed on a lower surface of the insulation layer 31. The wiring layer 32 includes via wirings, which extend through the insulation layer 31 in the thickness-wise direction, and a wiring pattern, which is formed on the lower surface of the insulation layer 31 and electrically connected to the wiring layer 23 by the via wirings.

The insulation layer 33 is formed on the lower surface of the insulation layer 31 to cover the wiring layer 32. The wiring layer 34 is formed on a lower surface of the insulation layer 33. The wiring layer 34 includes via wirings, which extend through the insulation layer 33 in the thickness-wise direction, and a wiring pattern, which is formed on the lower surface of the insulation layer 33 and electrically connected to the wiring layer 32 by the via wirings. The material of the insulation layers 31, 33 may be, for example, an insulative resin such as an epoxy resin or a polyimide resin or a resin material in which an insulative resin is mixed with a filler such as silica or alumina. The material of the wiring layers 32, 34 may be, for example, copper (Cu) or a copper alloy.

A plurality of (two, in FIG. 2A) insulation layers 41, 43 and a plurality of (two, in FIG. 2A) wiring layers 42, 44 are alternately formed on an upper surface of the substrate body 20. The insulation layer 41 is formed on the upper surface of the core substrate 21 to cover the wiring layer 24. The wiring layer 42 is formed on an upper surface of the insulation layer 41. The wiring layer 42 includes via wirings, which extend through the insulation layer 41 in the thickness-wise direction, and a wiring pattern, which is formed on the upper surface of the insulation layer 41 and electrically connected to the wiring layer 24 by the via wirings. The insulation layer 43 is formed on an upper surface of the insulation layer 41 to cover the wiring layer 42. The wiring layer 44 is formed on an upper surface of the insulation layer 43. The wiring layer 44 includes via wirings, which extend through the insulation layer 43 in the thickness-wise direction, and a wiring pattern, which is formed the upper surface of the insulation layer 43 and electrically connected to the wiring layer 42 by the via wirings. The material of the insulation layers 41, 43 may be, for example, an insulative resin such as an epoxy resin or a polyimide resin or a resin material in which an insulative resin is mixed with a filler such as silica or alumina. The material of the wiring layers 42, 44 may be, for example, copper (Cu) or a copper alloy.

A solder resist layer 50 is formed on the lower surface of the insulation layer 33 to partially cover the wiring layer 34. The solder resist layer 50 includes openings 50X, which partially expose the lower surface of the wiring layer 34 as external connection pads P1. The material of the solder resist layer 50 is, for example, a photosensitive dry film resist or a liquid photoresist. Such a resist material may be, for example, a novolac resin or an acryl resin. For example, when a photosensitive dry film resist is used, the lower surface of the insulation layer 33 and the wiring layer 34 are laminated with a dry film through thermocompression bonding. The dry film is patterned through photolithography to form the solder resist layer 50 that includes the openings 50X. When a liquid photoresist is used, the solder resist layer 50 may be formed through the same steps.

A protective insulation layer 60 is formed on the upper surface of the insulation layer 43 to partially cover the wiring layer 44. The protective insulation layer 60 includes openings 60X, which partially expose the upper surface of the wiring layer 44 as external connection pads P2. Each opening 60X is, for example, circular in a plan view. The material of the protective insulation layer 60 is, for example, a photosensitive dry film resist or a liquid photoresist. Such a resist material may be, for example, a novolac resin or an acryl resin. For example, when a photosensitive dry film resist is used, the upper surface of the insulation layer 43 and the wiring layer 44 are laminated with a dry film through thermocompression bonding. The dry film is patterned through photolithography to form the protective insulation layer 60 that includes the openings 60X. When a liquid photoresist is used, the protective insulation layer 60 may be formed through the same steps.

The wiring layer 44 is the uppermost wiring layer. The bumps 11, which serve as connection terminals, are formed on the wiring layer 44 (pads P2). Each bump 11 is electrically connected to the wiring layer 44 in the corresponding opening 60X of the protective insulation layer 60. The bump 11 partially projects toward an outer side of the opening 60X, that is, upwardly projects from an upper surface 60A of the protective insulation layer 60. One embodiment of a terminal structure includes the wiring layer 44, the bump 11, and the protective insulation layer 60.

Figure 2B:
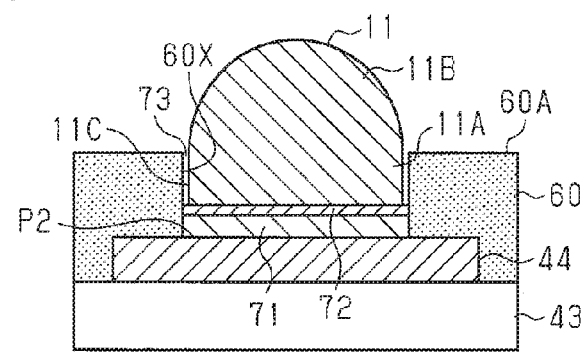
FIG. 2B is a partially enlarged cross-sectional view illustrating the wiring substrate of FIG. 2A.

As illustrated in FIG. 2B, it is preferred that a surface-processed layer 71 is formed on the upper surface of the uppermost wiring layer 44 in the opening 60X of the protective insulation layer 60 so that the surface-processed layer 71 is located between the bump 11 and the wiring layer 44. One embodiment of a terminal structure includes the wiring layer 44, the bump 11, the protective insulation layer 60, and the surface-processed layer 71. The surface-processed layer 71 includes a side surface that is in contact with the wall surface of the opening 60X, that is, the wall surface of the protective insulation layer 60 defining the opening 60X. The surface-processed layer 71 is a metal layer. The surface-processed layer 71 is, for example, a nickel (Ni) layer/palladium (Pd) layer/gold (Au) layer, that is, a metal layer in which the Ni layer serves as the bottom layer, and the Ni layer, the Pd layer, and the Au layer are sequentially formed. Alternatively, the surface-processed layer 71 may be an Au layer or an Ni layer/Au layer, that is, a metal layer in which the Ni layer serves as the bottom layer, and the Au layer is formed on the Ni layer. The Au layer is a metal layer of Au or an Au alloy. The Ni layer is a metal layer of Ni or an Ni alloy. The Pd layer is a metal layer of Pd or a Pd alloy.

The bump 11, which serves as a connection terminal, is formed on the surface-processed layer 71. The bump 11 includes a base portion 11A, which is located in the opening 60X of the protective insulation layer 60, and a connection portion 11B, which is formed on the base portion 11A and upwardly projects from the upper surface 60A of the protective insulation layer 60. The base portion 11A is rod-shaped (e.g., cylindrical). A gap 73 is formed between a side surface 11C of the base portion 11A and the wall surface of the protective insulation layer 60 defining the opening 60X. In the present example, the side surface 11C of the base portion 11A is spaced apart from the wall surface of the protective insulation layer 60 defining the opening 60X. Instead, the side surface 11C of the base portion 11A may partially contact the wall surface of the opening 60X. The connection portion 11B is semispherical and upwardly projects from an upper end of the base portion 11A. The upper end of the base portion 11A and an upper end of the wall surface of the opening 60X are located at the same level.

An alloy layer 72 is formed between the surface-processed layer 71 and the bump 11 (base portion 11A). One embodiment of a terminal structure includes the wiring layer 44, the bump 11, the protective insulation layer 60, the surface-processed layer 71, and the alloy layer 72. The alloy layer 72 is in contact with a lower surface of the base portion 11A of the bump 11 and an upper surface of the surface-processed layer 71. No alloy layer is formed on the side surface 11C of the base portion 11A. The bump 11 is formed, for example, from tin (Sn) or a tin alloy. The bump 11 is formed, for example, through electrolytic plating. When formed from a tin alloy, the bump 11 contains tin as the main component and also contains copper (Cu), Ni, Pd, Au, or the like. In this electrolytic plating, for example, a seed layer is formed through electroless plating, and the seed layer is used as a power feeding electrode (plating power feeding layer). Then, electrolytic plating is performed using the seed layer as the power feeding electrode to form an electrolytic plating layer, which functions as the bump 11, on the seed layer. The seed layer contains, for example, copper (Cu). The alloy layer 72 includes an alloy (Sn—Cu alloy) of the metal (containing copper) of the seed layer and the metal (containing tin) of the bump 11. When performing a reflow process to form the bump 11, the metal (e.g., tin) of the bump 11 and the metal (e.g., copper) of the seed layer perform counter diffusion. This forms the alloy layer 72. The alloy layer 72 may contain a metal (Au, Pd, Ni) that is diffused from the surface-processed layer 71.

The surface-processed layer 71 prevents formation of the alloy layer 72 that contains, for example, excessive copper and has an excessive thickness. If the surface-processed layer 71 is not formed, the seed layer, which is used for forming the bump 11, is formed on the upper surface of the wiring layer 44. In this case, when the reflow process is performed to form the bump 11, the metal (containing tin) of the bump 11, the metal (containing copper) of the seed layer, and the metal (containing copper) of the wiring layer 44 perform counter diffusion to form an alloy layer. The wiring layer 44 has a much larger amount of copper than the seed layer. This results in formation of an alloy layer (Sn—Cu alloy) containing excessive copper and having an excessive thickness. Such an alloy layer is mechanically brittle and easily forms cracks when receiving external stress. Consequently, a connection defect of the bump 11 easily occurs. In this regard, the surface-processed layer 71 is formed. This prevents formation of an alloy layer having an excessive thickness and limits occurrence of the connection defect of the bump 11.

The operation of the wiring substrate 10 will now be described. To compare with the wiring substrate 10, a comparative example of a wiring substrate will first be described. The same materials are used for the elements in the wiring substrate of the comparative example as those of the wiring substrate 10.

Figure 3:
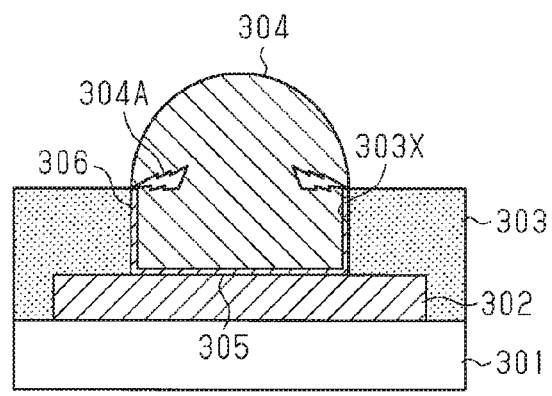
FIG. 3 is a partially enlarged cross-sectional view illustrating a comparative example of a wiring substrate (terminal structure)

FIG. 3 illustrates the wiring substrate (terminal structure) of the comparative example. As illustrated in FIG. 3, an insulation layer 301 includes an upper surface on which a wiring layer 302 is formed. Additionally, a protective insulation layer 303 is formed on the upper surface of the insulation layer 301 to cover the insulation layer 301 and a portion of the wiring layer 302. The protective insulation layer 303 includes an opening 303X, which partially exposes an upper surface of the wiring layer 302 as an external connection pad. A bump 304 is formed on the wiring layer 302. The bump 304 is formed, for example, from tin or a tin alloy through electrolytic plating. An alloy layer 305 is formed between the bump 304 and the wiring layer 302. Additionally, an alloy layer 306 is formed between the bump 304 and the protective insulation layer 303. The alloy layer 305 is in contact with a lower surface of the bump 304 and the upper surface of the wiring layer 302. The alloy layer 306 is in contact with a side surface of the bump 304 and a wall surface of the protective insulation layer 303 defining the opening 303X.

In this comparative example, the alloy layer 306, which is formed on the side surface of the bump 304, is in contact with the protective insulation layer 303. Thus, there is no gap between the side surface of the bump 304 and the wall surface of the opening 303X. The protective insulation layer 303 has a greater coefficient of thermal expansion (CTE) than the bump 304. Thus, stress, which is caused by a change in temperature and applied to the interface of the protective insulation layer 303 and the bump 304, concentrates on the upper end of the wall surface of the protective insulation layer 303 defining the opening 303X. This may form cracks 304A in the bump 304. The wiring substrate (terminal structure) of FIG. 3 does not include a surface-processed layer. However, the cracks 304A may also be formed even when a surface-processed layer is formed on the upper surface of the wiring layer 302.

In this regard, as illustrated in FIG. 2B, in the wiring substrate 10 of the present embodiment, the gap 73 is formed between the side surface 11C of the base portion 11A of the bump 11 and the wall surface of the protective insulation layer 60 defining the opening 60X. This limits stress applied to the bump 11 from the protective insulation layer 60. Thus, formation of cracks is limited. Additionally, in the present embodiment, the alloy layer 72 is located between the base portion 11A of the bump 11 and the surface-processed layer 71. The alloy layer 72 increases the connection strength between the bump 11 (base portion 11A) and the surface-processed layer 71. This limits formation of cracks between the bump 11 and the surface-processed layer 71, for example, when external force is applied to the bump 11. Consequently, a connection defect of the bump 11 to the surface-processed layer 71 is limited.

One example of a method for manufacturing the wiring substrate 10 will now be described.

Figure 4:
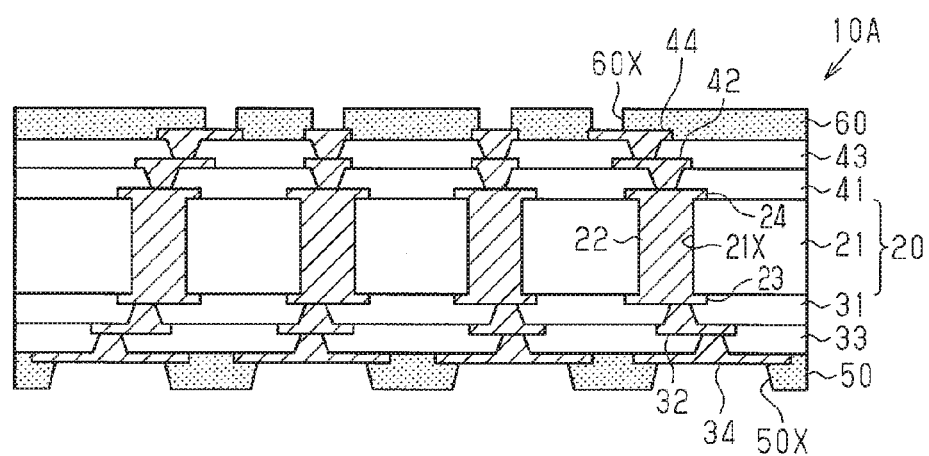
FIG. 4 is a schematic cross-sectional view illustrating a method for manufacturing the wiring substrate of FIG. 2A.

As illustrated in FIG. 4, before forming the bump 11 (refer to FIGS. 2A and 2B), a wiring substrate 10A is prepared. The wiring substrate 10A may be manufactured through a known manufacturing process and will now be briefly described with reference to FIG. 4.

The through holes 21X are formed in the core substrate 21 at given locations. The through electrodes 22 are formed in the through holes 21X by performing a plating process or applying a conductive paste. Then, for example, a subtractive process is performed to form the wiring layers 23, 24.

The upper surface and the lower surface of the core substrate 21 are each vacuum-laminated with a resin film. The resin films are heated and cured to form the insulation layers 41, 31. Alternatively, a resin paste or a liquid resin may be applied and heated to form the insulation layers 41, 31. Then, via holes are formed in each of the insulation layers 41, 31. If necessary, a desmear process is performed. Then, for example, a semi-additive process is performed to form the wiring layers 42, 32. Additionally, the insulation layers 43, 33 and the wiring layers 44, 34 are formed in the same manner.

The protective insulation layer 60 including the openings 60X is formed on the upper surface of the insulation layer 43. The solder resist layer 50 including the openings 50X is formed on the lower surface of the insulation layer 33. The protective insulation layer 60 is obtained, for example, by laminating a photosensitive solder resist film or applying a liquid solder resist and then performing photolithography to expose and develop the resist to obtain a pattern having a predetermined shape. In the same manner, the solder resist layer 50 is obtained, for example, by laminating a photosensitive solder resist film or applying a liquid solder resist and then performing photolithography to expose and develop the resist to obtain a pattern having a predetermined shape.

A method for forming the bump 11 will now be described. In the same manner as FIG. 2B, FIGS. 5A to 6D are each a partially enlarged view of the wiring substrate 10.

Figure 5A:
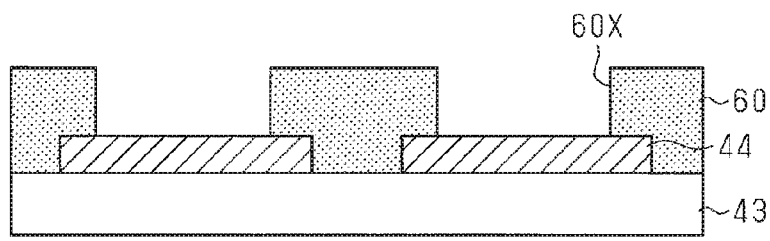
FIGS. 5A to 5D and 6A to 6D are partially enlarged cross-sectional views illustrating the method for manufacturing the wiring substrate subsequent to the manufacturing step of FIG. 4.

As illustrated in FIG. 5A, the upper surface of the wiring layer 44 is partially exposed by the openings 60X, which are formed in the protective insulation layer 60.

Figure 5B:
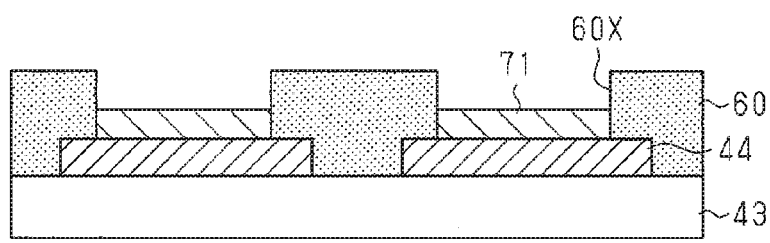

As illustrated in FIG. 5B, the surface-processed layer 71 is formed on the upper surface of the wiring layer 44 that is exposed by the openings 60X. The surface-processed layer 71 is formed, for example, by a nickel (Ni) layer/gold (Au) layer. The thickness of the surface-processed layer 71 is, for example, 1 μm to 10 μm.

When the structural body of FIG. 5A is immersed in a catalytic solution for electroless plating, the surface of the wiring layer 44 selectively adsorbs palladium (Pd), which is dissolved in the catalytic solution as ions. Electroless nickel plating is performed using the palladium as the catalyst to form a nickel layer on the upper surface of the wiring layer 44. Then, electroless gold plating is performed to form a gold (Au) layer on the nickel (Ni) layer. This forms the surface-processed layer 71 on the upper surface of the wiring layer 44.

Figure 5C:
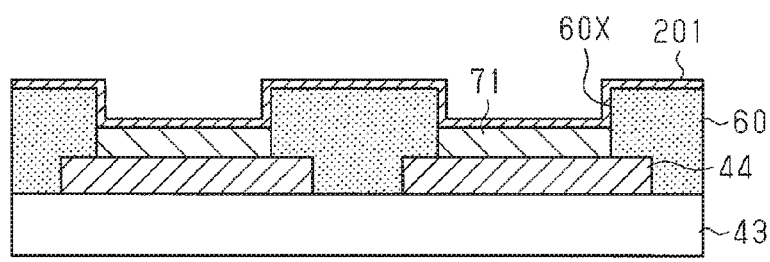

As illustrated in FIG. 5C, electroless plating is performed to form a seed layer 201, which continuously covers the surface of the protective insulation layer 60 and the upper surface of the surface-processed layer 71 that is exposed by the openings 60X. The material of the seed layer 201 may be, for example, copper or a copper alloy. Alternatively, the seed layer 201 may be formed, for example, through sputtering. The thickness of the seed layer 201 is, for example, 0.1 μm to 1 μm.

Figure 5D:
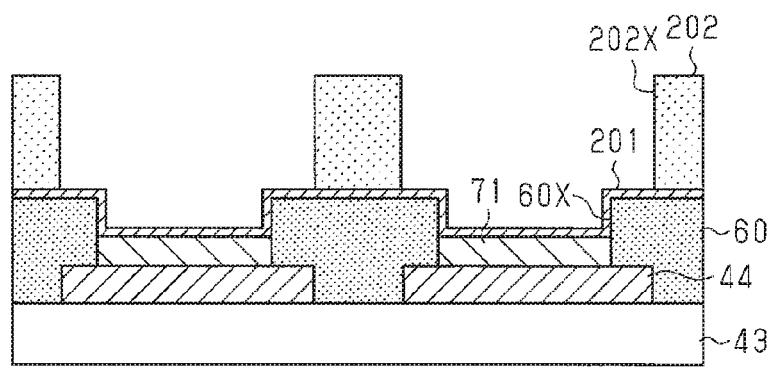

As illustrated in FIG. 5D, a resist layer 202 is formed on the surface of the seed layer 201 that is located on the protective insulation layer 60. Openings 202X are formed in the resist layer 202 at given locations. The openings 202X expose the surface of the seed layer 201 in a region corresponding to the openings 60X of the protective insulation layer 60 and the surface of the surface-processed layer 71. The openings 202X also expose the surface of the seed layer 201 extending around the openings 60X. Each opening 202X is, for example, circular in a plan view.

The material of the resist layer 202 may have resistance, for example, to plating performed in the next step. The material of the resist layer 202 may be, for example, a photosensitive dry film resist (e.g., novolac resin or acryl resin). In this case, the upper surface of the seed layer 201 is laminated with a dry film through thermocompression bonding. The dry film is patterned through photolithography to form the resist layer 202 that includes the openings 202X. Alternatively, a liquid photoresist (e.g., novolac resin or acryl resin) may be used to form the resist layer 202.

Figure 6A:
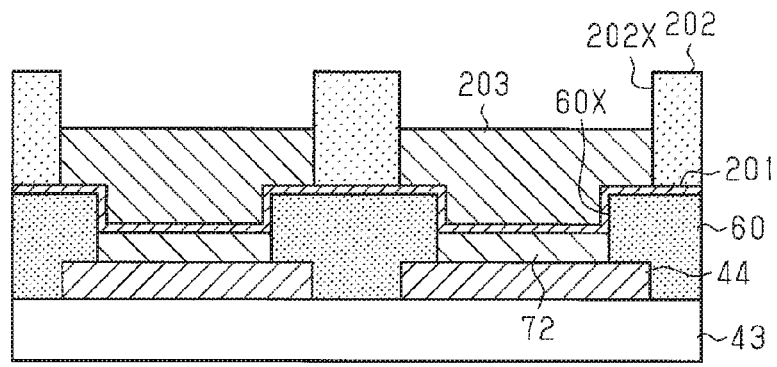

As illustrated in FIG. 6A, electrolytic plating (here, electrolytic tin plating) is performed using the resist layer 202 as a plating mask and the seed layer 201 as a plating power feeding layer to form an electrolytic plating layer 203 (electrolytic tin plating layer) on the upper surface of the seed layer 201 exposed from the openings 202X of the resist layer 202. The electrolytic tin plating layer 203 is formed on the seed layer 201 located in the openings 60X of the protective insulation layer 60 and the seed layer 201 extending around the openings 60X. The electrolytic tin plating layer 203 functions as the bump 11 illustrated in FIG. 2B. Thus, the thickness of the electrolytic tin plating layer 203 is set in accordance with the shape of the bump 11.

Figure 6B:
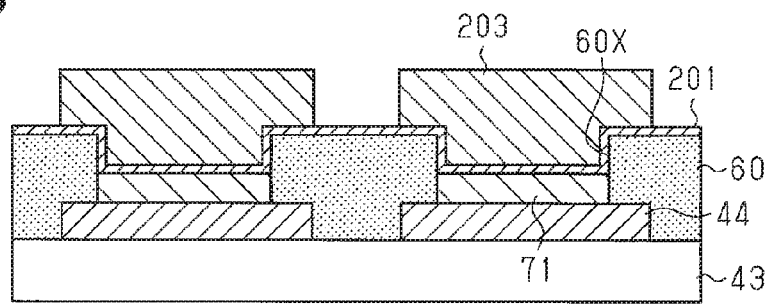

As illustrated in FIG. 6B, the resist layer 202 is removed. For example, an alkaline remover may be used to remove the resist layer 202.

Figure 6C:
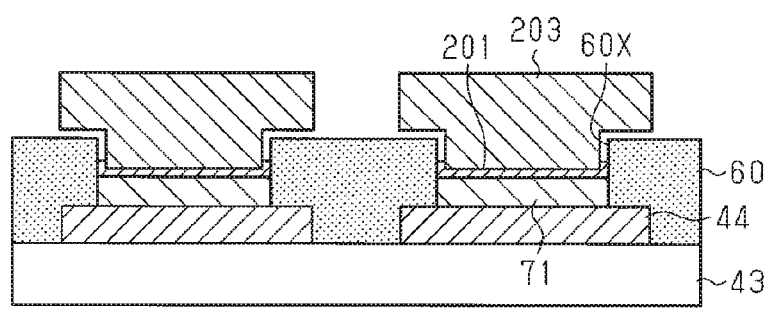

As illustrated in FIG. 6C, while using the electrolytic tin plating layer 203 as an etching mask, etching is performed, for example, with a flash etchant to remove the seed layer 201 exposed from the electrolytic tin plating layer 203. The flash etchant may be, for example, a sulfuric acid solution (e.g., solution of ammonium persulfate) or a solution of hydrogen peroxide mixed with sulfuric acid.

When removing the seed layer 201 exposed from the electrolytic tin plating layer 203, etching is excessively performed to remove the seed layer 201 located between the electrolytic tin plating layer 203 and the protective insulation layer 60. At this time, etching time or the like is set so that the seed layer 201 remains on the surface-processed layer 71. Additionally, the seed layer 201 located between the electrolytic tin plating layer 203 and the protective insulation layer 60 may remain at the lower end of the electrolytic tin plating layer 203.

Figure 6D:
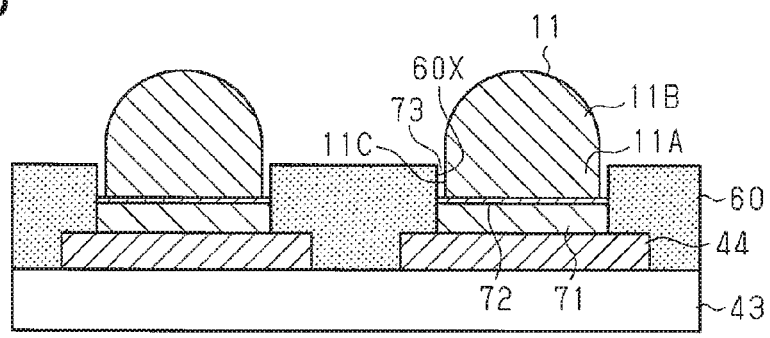

As illustrated in FIG. 6D, a reflow process is performed to melt the electrolytic tin plating layer 203. Consequently, the upper surface of the electrolytic tin plating layer 203 becomes spherical. This forms the bumps 11. Additionally, the alloy layer 72 is formed from the electrolytic tin plating layer 203 and the seed layer 201 at the lower end of each bump 11.

The seed layer 201 located between the protective insulation layer 60 and the electrolytic tin plating layer 203 has been removed through the above etching. Thus, when the electrolytic tin plating layer 203 is molten through the reflow process, the electrolytic tin plating layer 203 is not bonded to the wall surfaces of the protective insulation layer 60 defining the openings 60X. Consequently, when the bumps 11 are cooled to contract, the side surface 11C of the base portion 11A of each bump 11 is spaced apart from the wall surface of the protective insulation layer 60 defining the corresponding opening 60X. This forms the gap 73 between the side surface 11C of the base portion 11A and the wall surface of the opening 60X.

The present embodiment has the advantages described below.

(1) The protective insulation layer 60 is formed on the upper surface of the insulation layer 43 to partially cover the wiring layer 44. The protective insulation layer 60 includes the openings 60X, which partially expose the upper surface of the wiring layer 44 as the external connection pads P2. The bumps 11 are formed on the wiring layer 44, which is the uppermost wiring layer, to serve as connection terminals. The bumps 11 are electrically connected to the wiring layer 44 in the openings 60X of the protective insulation layer 60. Each bump 11 includes the base portion 11A, which is located in the corresponding opening 60X of the protective insulation layer 60, and the connection portion 11B, which is formed on the base portion 11A and upwardly projects from the upper surface 60A of the protective insulation layer 60. The gap 73 is formed between the side surface 11C of the base portion 11A and the wall surface of the opening 60X (i.e., wall surface of the protective insulation layer defining the opening 60X). This limits stress applied to the bump 11 from the protective insulation layer 60. Thus, formation of cracks is limited.

(2) The surface-processed layer 71 and the alloy layer 72 are formed between the upper surface of the wiring layer 44 and the lower surface of the base portion 11A of each bump 11. The alloy layer 72 is located between the surface-processed layer 71 and the base portion 11A of the bump 11. The alloy layer 72 increases the connection strength between the bump 11 (base portion 11A) and the surface-processed layer 71. This limits formation of cracks between the bump 11 and the surface-processed layer 71, for example, when external force is applied to the bump 11. Consequently, a connection defect between the bump 11 and the surface-processed layer 71 is limited.

(3) The surface-processed layer 71 is formed on the upper surface of the wiring layer 44 in the openings 60X of the protective insulation layer 60. The side surface of the surface-processed layer 71 is in contact with the wall surface of the protective insulation layer 60 defining the opening 60X. The alloy layer 72 is in contact with the lower surface of the base portion 11A of each bump 11 and the upper surface of the surface-processed layer 71. Thus, the alloy layer 72 is located above the interface of the protective insulation layer 60 and the wiring layer 44, that is, the upper surface of the wiring layer 44. Therefore, when the difference in physical properties between the protective insulation layer 60 and the wiring layer 44 generates stress between the protective insulation layer 60 and the wiring layer 44, the stress is not directly applied to the alloy layer 72. This prevents breakage of the alloy layer 72.

It should be apparent to those skilled in the art that the foregoing embodiments may be employed in many other specific forms without departing from the scope of this disclosure. Particularly, it should be understood that the foregoing embodiments may be employed in the following forms.

The shape and size of each element in the above embodiment may be modified.

Figure 7:
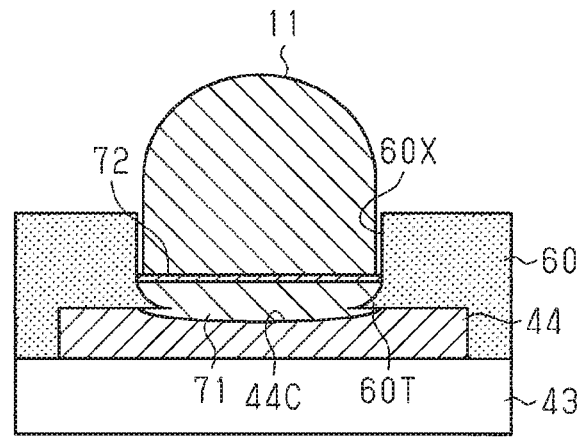
FIG. 7 is a partially enlarged cross-sectional view of another wiring substrate (terminal structure)

As illustrated in FIG. 7, the upper surface of the wiring layer 44 may include a recess 44C. A peripheral portion of the recess 44C is located below a projection 60T of the protective insulation layer 60. The projection 60T inwardly projects from the lower end of the wall surface of the opening 60X (i.e., wall surface of the protective insulation layer 60) so that the projection 60T is located above the peripheral portion of the recess 44C. The lower surface of the projection 60T is located at the same level as the upper surface of the wiring layer 44. The surface-processed layer 71 is formed in the recess 44C to fill the gap (i.e., peripheral portion of recess 44C) between a lower surface of the projection 60T of the protective insulation layer 60 and the wiring layer 44. This further increases the connection strength between the wiring layer 44 and the bump 11.

A method for manufacturing the terminal structure of FIG. 7 will now be described.

Figure 8A:
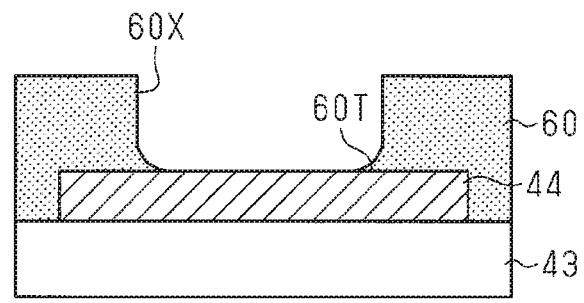
FIGS. 8A and 8B are partially enlarged cross-sectional views illustrating a method for manufacturing the terminal structure of FIG. 7.
Figure 8B:
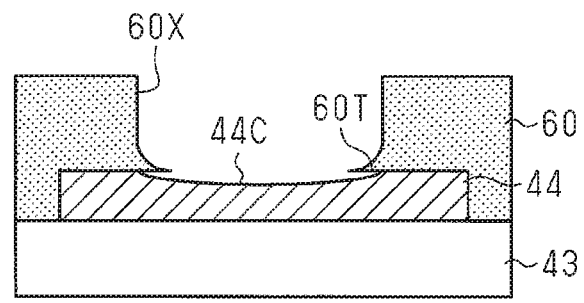

As illustrated in FIG. 8A, the opening 60X is formed in the protective insulation layer 60. In this step, the condition of photolithography is set so that the lower end of the wall surface of the opening 60X is curved. Thus, the protective insulation layer 60 includes the projection 60T at the lower end of the opening 60X. As illustrated in FIG. 8B, the upper surface of the wiring layer 44 is etched through the opening 60X of the protective insulation layer 60 to form the recess 44C. When the wiring layer 44 is formed from, for example, copper or a copper alloy, a solution of copper(II) chloride or a solution of ferric chloride may be used as an etchant.

After forming the recess 44C in the above manner, in the step of FIG. 5B, electroless plating is performed to form the surface-processed layer 71. The surface-processed layer 71 is formed in the recess 44C to fill the gap (i.e., peripheral portion of recess 44C) between the lower surface of the projection 60T of the protective insulation layer 60 and the wiring layer 44. Then, in the same manner as the above embodiment, the steps from FIG. 5C are performed to obtain the terminal structure of FIG. 7.

In the same manner as the recess 44C of FIG. 7, the upper surface of the wiring layer 44 of FIG. 2B may include a recess. The recess includes a peripheral portion that serves as a gap between the lower end of the wall surface of the opening 60X (i.e., wall surface of the protective insulation layer 60) and the wiring layer 44. In this case, the entire wall surface of the opening 60X (i.e., entire wall surface of the protective insulation layer 60) serves as a projection located above the peripheral portion of the recess. Then, the surface-processed layer 71 is formed in the recess to fill the gap. This further increases the connection strength between the wiring layer 44 and the bump 11.

Figure 9:
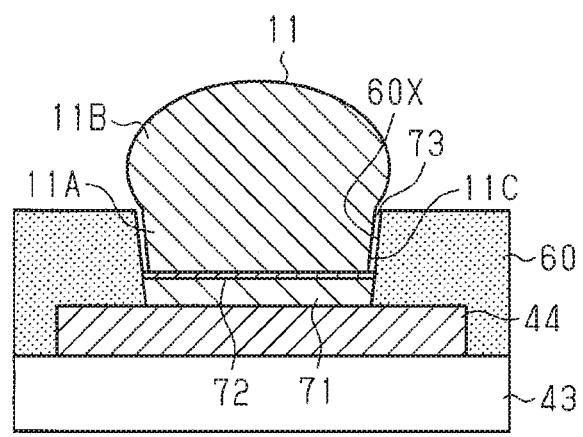
FIG. 9 is a partially enlarged cross-sectional view of another wiring substrate (terminal structure).

As illustrated in FIG. 9, the diameter of the opening 60X may be gradually increased from the upper surface of the wiring layer 44 toward the upper surface of the protective insulation layer 60. The opening 60X may be tapered in a cross-sectional view. Even when the opening 60X has such a structure, the gap 73 is formed between the side surface 11C of the base portion 11A of the bump 11 and the wall surface of the opening 60X. As illustrated in FIG. 9, the connection portion 11B of the bump 11 expands sideward from the upper end of the wall surface of the opening 60X of the protective insulation layer 60 so as to be, for example, spherical. The connection portion 11B of the bump 11 of FIG. 2B may be spherical like the connection portion 11B of FIG. 9.

The surface-processed layer 71 of FIG. 2B may be omitted from the above embodiment.

Referring to FIG. 2A, in the above embodiment, if necessary, a surface-processed layer may be formed on the wiring layer 34 (external connection pads P1) exposed from the openings 50X. Examples of the surface-processed layer include a gold (Au) layer, a nickel (Ni) layer/Au layer (metal layer in which Ni layer and Au layer are sequentially formed), and an Ni layer/palladium (Pd) layer/Au layer (metal layer in which Ni layer, Pd layer, and Au layer are sequentially formed). The Au layer, the Ni layer, and the Pd layer may each be, for example, an electroless plating metal layer formed through electroless plating. The Au layer is a metal layer of Au or an Au alloy. The Ni layer is a metal layer of Ni or an Ni alloy. The Pd layer is a metal layer of Pd or a Pd alloy. Additionally, an anti-oxidation process such as an organic solderability preservative (OSP) process may be performed on the surface of each external connection pad P1 to form the surface-processed layer. For example, when the OSP process is performed, the surface-processed layer of an organic coating formed from an azole compound or an imidazole compound is formed on the surface of the external connection pad P1. The wiring layer 34 exposed from the openings 50X may be used as the external connection terminals. When a surface-processed layer is formed on the wiring layer 34, the surface-processed layer may be used as the external connection pads.

In the above embodiments and modified examples, the terminal structure of the wiring substrate 10 may be applied to the terminal structure of a semiconductor package such as a chip size package (CSP) or a wafer level package (WLP).

Clauses

This disclosure further encompasses the following embodiments.

1. A method for manufacturing a terminal structure, the method including:

forming a wiring layer;

forming a protective insulation layer including an opening that partially exposes an upper surface of the wiring layer;

forming a seed layer that covers the upper surface of the wiring layer exposed from the opening and a surface of the protective insulation layer;

forming a plating mask on the seed layer, wherein the plating mask exposes the seed layer in a region including the opening;

performing electrolytic plating using the seed layer as a power feeding electrode to form an electrolytic plating layer on a portion of the seed layer that is exposed from the plating mask;

removing the plating mask;

performing etching to remove a portion of the seed layer exposed from the electrolytic plating layer and a portion of the seed layer located between the protective insulation layer and the electrolytic plating layer; and performing a reflow process on the electrolytic plating layer.

2. The method according to clause 1, wherein the plating mask exposes a portion of the seed layer corresponding to the opening and a portion of the seed layer around the opening, and the electrolytic plating layer is formed on the portion of the seed layer corresponding to the opening and the portion of the seed layer around the opening.

3. The method according to clause 1 or 2, wherein the etching includes performing etching excessively to remove the portion of the seed layer located between the electrolytic plating layer and a wall surface of the protective insulation layer defining the opening.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A terminal structure comprising:

a wiring layer;

a protective insulation layer including an opening that partially exposes an upper surface of the wiring layer;

a metal layer formed on the upper surface of the wiring layer in the opening;

an alloy layer formed on the metal layer; and a connection terminal formed on the alloy layer, wherein:

the connection terminal includes a base portion formed in the opening and connected to the wiring layer by the alloy layer and the metal layer, and a connection portion formed on the base portion and projecting from an upper surface of the protective insulation layer, wherein a gap is formed between a side surface of the base portion and a wall surface of the opening, and wherein the side surface of the base portion is free from the alloy layer;

the upper surface of the wiring layer includes a recess;

the protective insulation layer includes a projection located above a peripheral portion of the recess; and the metal layer is formed in the recess to fill a gap between a lower surface of the projection and the wiring layer.

2. The terminal structure according to claim 1, wherein the alloy layer contains a tin-copper alloy.

3. The terminal structure according to claim 1, wherein the entire side surface of the base portion is spaced apart from the wall surface of the opening.

4. The terminal structure according to claim 1, wherein the side surface of the base portion is spaced apart from at least an upper end of the wall surface of the opening.

5. A wiring substrate comprising:

a wiring layer;

an insulation layer formed on the wiring layer; and the terminal structure of claim 1, wherein the terminal structure is formed on the insulation layer.

6. The terminal structure according to claim 1, wherein the connection terminal contains tin.

7. The terminal structure according to claim 1, wherein the wiring layer is formed from copper or a copper alloy.

8. The terminal structure according to claim 1, wherein the metal layer contains nickel, palladium, or gold.

9. The terminal structure according to claim 1, wherein the opening is tapered in a cross-sectional view to have a diameter that is gradually decreased from the upper surface of the protective insulation layer toward the upper surface of the wiring layer, the base portion is tapered in a cross-sectional view to have a diameter that is gradually decreased from an upper end of the base portion toward a lower end of the base portion.

10. The terminal structure according to claim 1, wherein the metal layer covers an upper surface of the projection.

* * * * *